United States Patent [19]

Weisman et al.

[11] 4,335,819
[45] Jun. 22, 1982

[54] CARD CAGE ENTRY GUIDE

[76] Inventors: Arnold Weisman, 325 Crestglen Rd., Glendora, Calif. 91740; Mitchell Merritt, 5594 Temple City Blvd., Temple City, Calif. 91780

[21] Appl. No.: 167,811

[22] Filed: Jul. 14, 1980

[51] Int. Cl.³ .............................................. H05K 7/14
[52] U.S. Cl. ...................................... 211/41; 361/415
[58] Field of Search ................... 211/41, 162, 94, 94.5; 361/415

[56] References Cited

U.S. PATENT DOCUMENTS

| 3,382,476 | 5/1968 | Novet | 361/415 X |
| 3,723,823 | 3/1973 | Lit et al. | 211/41 X |
| 3,731,157 | 5/1973 | Reimer | 361/415 |
| 4,019,099 | 4/1977 | Calabro | 211/41 X |

FOREIGN PATENT DOCUMENTS 1578065  8/1969  France ................................... 211/41

Primary Examiner—Roy D. Frazier
Assistant Examiner—Robert W. Gibson, Jr.

[57] ABSTRACT

A guide device is disclosed which assists in the positioning of cards in a card cage by adding to the front of a channel retaining a card edge a V-shaped entrance formed by complimentarily shaped guide members. The guide members each include a peg which is inserted through an associated hole in front of the channel into an associated aperture in a base member. The peg and associated base member aperture are complimentarily sized to permit the peg to be retained by the base member. The guide members are attached to the base member via flexible ribbons.

10 Claims, 6 Drawing Figures

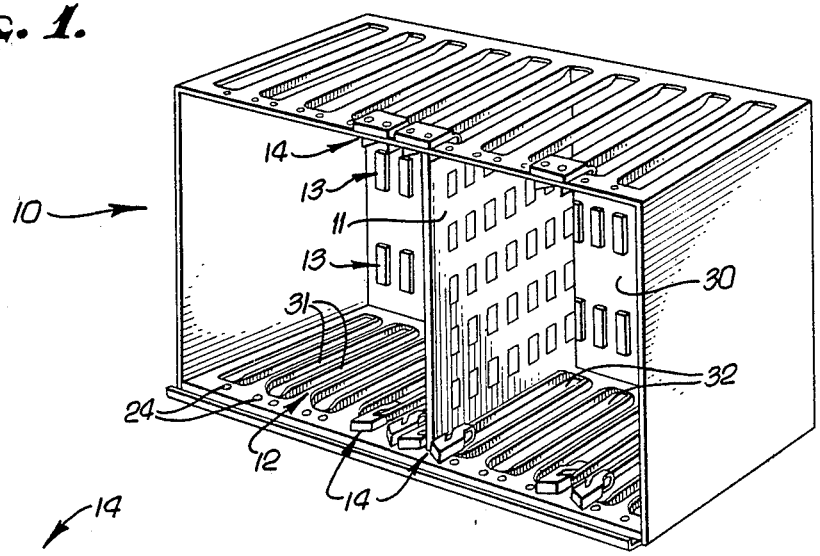
Fig. 1.
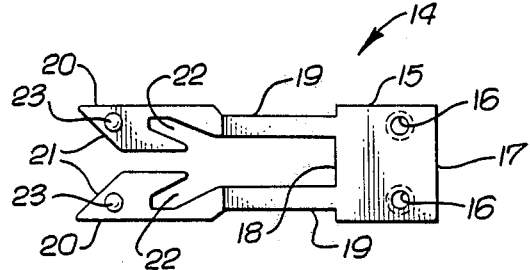
Fig. 2.
Fig. 3.
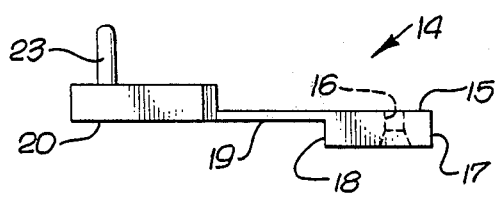
Fig. 4.
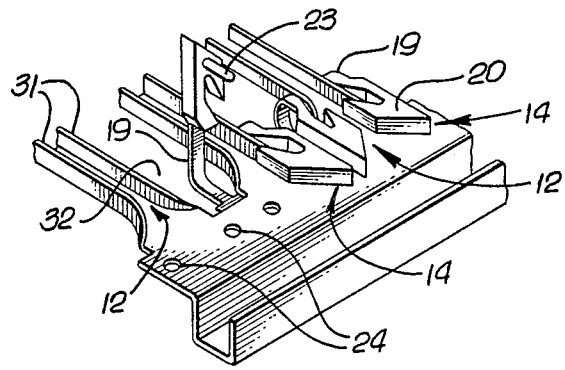
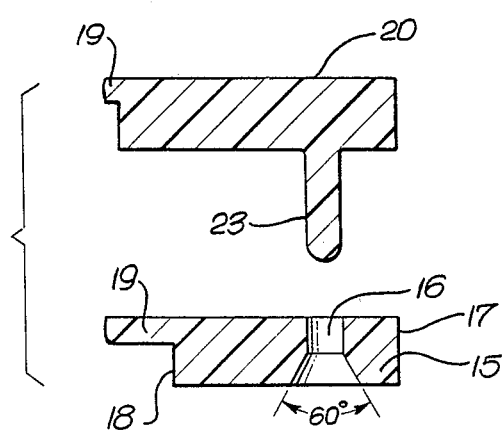
Fig. 5.

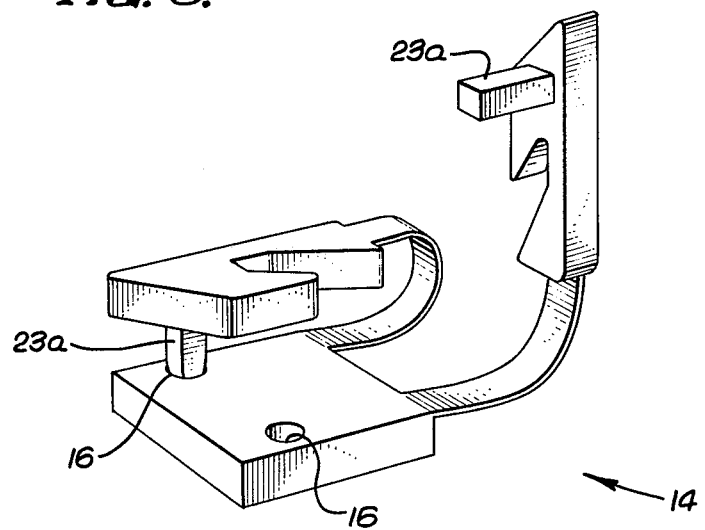

CARD CAGE ENTRY GUIDE

BACKGROUND OF THE INVENTION

1. Field of the Invention

The invention relates to devices for assisting in the positioning of cards in a card cage, specifically for the assisting in the placing of printed circuit boards into metal louver card cages.

2. Description of Prior Art

A common method for implementing electronic circuits is by use of thin, generally rectangular printed circuit boards. Such boards mechanically support various components such as integrated circuit "chips", resistors, capacitors, and transistors, as well as provide for one or more layers of electrical wiring. Such boards are easy to manufacture in quantity, and are versatile in application. Highly sophisticated electronic devices often require several boards to provide the desired functions. In order to properly support and interconnect several boards, a card cage is used.

A card cage is a box with an open side. On the side opposite the open side are usually placed electrical connectors which are cooperatively shaped and positioned to allow insertion of an edge or portion of an edge of a card, creating an electrical connection to the circuitry on each card. The connectors are themselves electrically interconnected. A popular construction technique is to use a printed circuit board, commonly called a "mother board", as the card cage side having the electrical connectors to appropriately interconnect the various cards.

In order to securely retain these various cards in the card cage, various guides are used to support the two sides of each card which are adjacent the side which has the electrical connectors. Typically, the top and bottom of the card cage will have metal louvers which form grooves or channels into which the various cards may slide. Each card portion has associated louvers on the top and bottom of the card cage, which form a pair of channels, and create a slot into which a card may slide. A printed circuit board which has been inserted into a slot is supported on three sides by the two channels at the top and bottom of the card cage, and by the mother board via the electrical connectors.

One difficulty with such card cages is that it is easy to misposition a card as it is slid into the card cage by sliding one of its edges between louvers which do not comprise part of the desired slot's channels. If a card is even slightly tilted as it is inserted into the cage, it may engage louvers which will maintain that misentry until the card is attempted to be inserted in to the electrical connectors at the rear of the slot. Since the louvers are close together to permit a tight packing of cards, it is sometimes difficult to determine which channel on the top is associated with a channel on the bottom of the card cage.

Another difficulty is that occasionally after a card cage has been designed, it is found that the louvers are insufficiently high to create a channel sufficiently deep to securely retain the cards. For instance, a production run of cards may be slightly bowed, requiring higher louvers to securely maintain the card in the channel.

Accordingly, it is an object of the invention to provide a device which assists in the proper positioning of a card in a card cage. It is an object of the invention to provide a simple method to determine which louvers on the top and bottom of a louver type card cage are associated with each other as part of a card slot. It is another object of the invention to provide a device which increases the height of the channel formed by louvers in a card cage to insure better retention of cards. Yet another object of the invention is to provide a device which enhances the guiding of a card into a card cage and which is easily added to a previously designed card cage if such is necessary.

SUMMARY OF THE INVENTION

These and other objects of the invention are obtained by a guide device which fits around the louvers forming a channel for a card slot to create a V-shaped entrance to the channel. The guide device may be colored so as to permit easy association between the upper and lower channels which form a card slot. The guide device has a rectangular base with two apertures passing from its top through it to its bottom. Two elongated flexible, ribbon-like elements are attached to the front surface of the base. The ribbon members are generally parallel to each other. The free ends of the ribbon members are enlarged and complementarily shaped to form a V-shaped entrance to the space between the ribbon members. The ribbon members are sufficiently flexible to allow them to be bent so as to bring the top surface of the elongated ends in proximity to the top surface of the base member. The top surface of each elongated end of the ribbon members has a peg suitably shaped so as to be able to be securely retained in an associated one of the base member apertures.

On the card cage side in front of the louvers forming a channel, two holes are drilled. The holes are complimentarily shaped and positioned to permit the base member apertures to be lined up directly below the card cage holes. When the base member is so positioned, and the ribbon members are bent around to the opposite surface of the card cage side so as to bring the elongated ends to the front of the groove formed by the louvers, the pegs of the ribbon members are inserted through the holes in the card cage side and through the associated base member apertures, thereby securely retaining the inventive guide device in front of a card cage channel.

The enlarged ends of the ribbon members may be made sufficiently thick so as to themselves assist in the retention of cards in the card cage.

BRIEF DESCRIPTION OF THE DRAWINGS

FIG. 1 is a perspective view of a card cage, illustrating the use of the inventive guide device.

FIG. 2 is a top view of one embodiment of the inventive guide device.

FIG. 3 is a side view of the embodiment illustrated in FIG. 2.

FIG. 4 is a perspective view of the embodiment illustrated in FIGS. 2 and 3 showing the manner in which the guide device may be positioned at the front of the louvers forming a groove for a card slot.

FIG. 5 is a partial sectional view of the base member and a ribbon member end.

FIG. 6 is a perspective view of an alternative embodiment of the inventive guide device in which the manner by which the peg of a ribbon member end may be inserted into its associated base member aperture is shown without the card cage for clarity.

DESCRIPTION OF PREFERRED EMBODIMENTS

The inventive guide device is adapted for use with printed circuit board card cages and the like, so as to assist in the positioning of cards in such a card cage in a convenient and accurate manner. FIG. 1 illustrates such a use. A card cage 10 is generally a rectangular box with one open side into which cards may be inserted. Opposite the open side are usually plural electrical connectors 12. Channels 12 are on two opposite sides of the card cage 10. Each channel 12 is associated with a channel 12 directly opposite it on the opposite side to form a slot into which a card 11, such as a printed circuit board, may be slid. Typically, such a card 11 has protrusions which engage associated electrical connectors 13 on the rear 30 of the cage 10.

The channels 12 may be formed by louvers 31 punched into the sides of the card cage 10. Forming a channel 12 in such a manner causes open areas 32 between adjoining channels 12 to also be formed.

The inventive guide device 14 is positioned at the front of each channel 12 to assist in the positioning of a card 11 in the card cage 10. The inventive guide device 14 may be color coded so as to visually assist in identifying the channels which form a card slot.

FIG. 2 is a top view of one embodiment of the inventive guide device 14. The embodiment illustrated in FIG. 2 is unitary and made of a plastic material such as nylon 6/6, a material well known and commercially available in the industry. Nylon 6/6 is advantageous since it is self-extinguishing to flame, may be used at temperatures as high as 250 degrees F., and is resistant to alkalies, weak acids and common solvents. In addition, as will be described below, when formed into the thin ribbon, it is flexible. Although nylon 6/6 is used in a preferred embodiment of the invention, other materials, including other thermoplastics, are suitable for use in the invention.

The preferred embodiment in FIG. 2 has a base member 15 which is generally rectangular. The base member also contains two apertures 16 passing from the top to the bottom of the base member. In the preferred embodiment, these apertures are spaced near opposite sides of the base member and equally distant from its back side 17.

Attached to the front side 18 of the base member are two elongated ribbon-like extensions 19. Each of the ribbon members 19 has a thickened end 20, as also shown in FIG. 3, a side view of the embodiment illustrated in FIG. 2. The free ends are cooperatively shaped to have angled front portions 21 which create a V-shaped groove into the space between the ribbon members 19. As will be discussed in more detail below, the resulting V-groove assists in the guiding of a card into the desired card cage channels 12.

The free thickened ribbon member ends 20 may be configured to have an indentation 22 which, as will be described in more detail below, securely engages a portion of the louvers 31 forming a channel.

As seen in FIG. 3, each ribbon member end 20 also includes a peg 23 generally perpendicular to the top surface of the ribbon member end 20.

FIG. 4 illustrates how the embodiment of the invention illustrated in FIGS. 2 and 3 may be used in conjunction with a louver-type card cage. At the front of each channel 12 are formed a pair of apertures 24 through the card cage surface. These card cage apertures 24 are suitably sized and positioned to correspond to the apertures 16 of the base member 15. The base member 15 is positioned directly below the channel 12 so as to line up its apertures 16 with those of the card cage channel 12. Each ribbon member 19 is sufficiently flexible to allow it to be bent to bring the peg 23 of a ribbon member's end 20 into proximity with one of the channel apertures 24. Each peg 23 is then inserted through the appropriate channel member aperture into a base member aperture 16. Each peg 23 and associated base member aperture 16 are appropriately configured so as to cause the secure retention of the peg 23 in the aperture 16. As indicated in FIG. 4, the resulting guide device 14, when attached to the front area of a channel 12 provides a V-groove guide into the channel 12. In addition, if the ribbon member ends 20 are made appropriately thick, the guide device 14 may itself be used to securely engage a portion of the card's edge. In addition, the indentation 22 which may be provided on the ribbon member ends 20 partially surrounds the very end of a louver 31, and thereby prevents rotational movement of the free ends 20 about their pegs 23.

As was mentioned earlier, the inventive guide devices 14 may be suitably colored so as to allow visual association of the two channels 12 forming a card slot.

In addition, use of the inventive guide devices 14 with adjacent channels 12 substantially or entirely fills the front of the open areas 32 between channels 12. Accordingly, when a card 11 is being inserted into the card cage 10, there is little or no possibility that it may mistakenly be partially inserted between channels 12.

FIG. 5 is a partial sectional view of the base member 15 and a ribbon member end 20 as a peg 23 is about to be inserted into its associated base member aperture 16. It is desirable to allow for easy insertion and removal of the inventive guide device 23 from a card cage 10, yet insure that it will remain securely in position in the card cage 10. Accordingly, it has been found desirable to shape the base member apertures 16 so that they have a circular cross section of constant radius from the top surface of the base member 15 to 50-60% through the base member 15. At this point, the cross-sectional radius of the aperture increases so as to form a portion of a circular cone. In the preferred embodiment, the rate of increase in cross-sectional radius corresponds to a circular cone having an apex angle of 60 degrees. That is, to say, the opposite sides of this portion of the aperture 16, if continued so as to intersect each other would form an angle of 60 degrees.

In one embodiment, a peg was formed with a square cross-section as indicated at 23a in FIG. 6. Each peg 23a has a diagonal length of 0.095 inches, whereas the initial diameter of the aperture 16 was 0.080 inches. Such a configuration has been found, when used in conjunction with nylon 6/6, to provide for a device in which the pegs 23 may be press-fit into their associated apertures 16 with a finger pressure between 3 and 9 pounds per peg. Further, the pegs are easily removed, allowing for removal of the entire inventive guide device 14.

While only a limited number of embodiments of the disclosed invention have been discussed, it will be readily apparent to persons skilled in the art that certain changes and modifications may be made without departing from the spirit of the invention. Accordingly, the foregoing disclosure, description and figures are for illustrative purposes only, and do not in any way limit the invention, which is defined only by the claims.

We claim:

1. A guide device, comprising:
a rectangular base member having first and second apertures passing through the base member from its top to bottom;
first and second elongated ribbon members, associated with the first and second apertures respectively, the ribbon members generally parallel to each other and attached to the front side of the base member adjacent first and second base member sides respectively;
each ribbon member having a thickened end, the fronts of said ends complimentarily shaped to form a V-shaped entrance to the space between the ribbon members;
the ribbon members each having sufficient length and elasticity to permit it to be bent to bring the top of its end into proximity with the top of the base member above its associated aperture; and
each ribbon member's end having a peg member generally perpendicular to its top surface, the peg member so sized and positioned to permit its removable retention in the associated aperture.

2. A guide device according to claim 1 wherein the apertures are positioned near the rear side of the base member and equally spaced from the first and second member sides, respectively.

3. A guide device according to claim 1 wherein the apertures have generally circular cross section, and the peg members have generally square axial cross section.

4. A guide device, comprising:
a thin generally rectangular base member, with top and bottom, and first through fourth sides, the first and second sides parallel to each other and the third and fourth sides parallel to each other, the base member having first and second apertures passing through it from the top to bottom, the first and second apertures equally spaced from the first and second side respectively, and equally spaced from the third side;
first and second thin flexible ribbons, each affixed at one end to the fourth base member side and adjacent the first and second base member side respectively;
first and second similarly shaped guide members, a side of each affixed respectively to the second end of the first and second ribbons and slightly spaced apart, each guide member having an angled side opposite the side affixed to the ribbon, the angled sides cooperating to form a V-shaped entrance to the space between the guide members.

5. For use with a card cage having first and second channels directly opposite each other and on the interior of first and second cage sides respectively, the channels configured to form a slot for retaining a card on opposite edges, each of the first and second cage sides having openings on both sides of its channel, and further having a pair of apertures through the side positioned in front of the associated channel, the aperture pairs separated by more than the width of the card, a guide device for use with a channel comprising:
a base member, having a pair of apertures similarly spaced apart as the pair of cage side apertures;
a pair of guide members, each having a peg, each peg configured to position its guide member in front of the channel by being inserted through one of the associated side apertures and retained in an associated one of the base member apertures, the guide members complimentarily configured to present a V-shaped entrance to the channel when the pegs are so inserted in the side apertures and retained in the base member; and
first and second flexible ribbon members affixed at one end to the base member, each ribbon member affixed at its other end to an associated guide member, the ribbon members of length and flexibility to couple the guide members to the base members through the channel openings when the pegs are inserted in the side apertures and retained in the base member.

6. A guide device according to claim 5 wherein the guide device is unitary and made of nylon 6/6.

7. A guide device according to claim 5 for use in a card cage having plural channels on its first and second sides, wherein the guide members of the guide devices used with the first and second channels are similarly colored to thereby allow visual association of the channel forming the slot.

8. A guide device according to claim 5 wherein the guide members are sufficiently high to assist in the retention of the card in the channels.

9. A guide device according to claim 5 wherein each peg has square cross-section, and the base member apertures have a circular cross-section.

10. A guide device according to claim 5 wherein the channels are formed by a pair of louvers, and each guide member includes an indention configured to engage the front of an associated channel louver to limit rotation of the guide member about its peg when the guide member is inserted in its side aperture.

* * * * *